United States Patent
Miyamoto (10) Patent No.: US 6,483,305 B1
(45) Date of Patent: Nov. 19, 2002

(54) MAGNETIC RESONANCE METHOD FOR REDUCING RESIDUAL MAGNETIZATION AND ADJUSTING THE AMPLITUDE OF GRADIENT PULSES

(75) Inventor: Shoei Miyamoto, Tokyo (JP)

(73) Assignee: GE Yokogawa Medical Systems, Limited, Tokyo (JP)

( * ) Notice: Subject to any disclaimer, the term of this patent is extended or adjusted under 35 U.S.C. 154(b) by 144 days.

(21) Appl. No.: 09/597,527

(22) Filed: Jun. 20, 2000

(30) Foreign Application Priority Data

Aug. 20, 1999 (JP) ............................................. 11-233364

(51) Int. Cl.⁷ ................................................ G01V 3/00
(52) U.S. Cl. ........................................ 324/307; 324/309
(58) Field of Search .................................. 324/300, 306, 324/309, 311, 312, 313, 314, 318, 322

(56) References Cited

U.S. PATENT DOCUMENTS

| | | | | |
|---|---|---|---|---|
| 4,973,906 A | * | 11/1990 | Bernstein | 324/309 |
| 5,055,790 A | * | 10/1991 | Siuciak et al. | 324/309 |
| 5,280,244 A | * | 1/1994 | Hinks | 324/306 |
| 5,311,133 A | * | 5/1994 | Dannels | 324/309 |
| 5,729,139 A | * | 3/1998 | Goto | 324/309 |
| 6,043,656 A | * | 3/2000 | Ma et al. | 324/309 |
| 6,127,825 A | * | 10/2000 | Goto | 324/307 |
| 6,218,834 B1 | * | 4/2001 | Goto | 324/307 |
| 6,400,151 B1 | * | 6/2002 | Haase et al. | 324/309 |
| 2001/0017544 A1 | * | 8/2001 | Miyamoto | 324/314 |
| 2002/0047708 A1 | * | 4/2002 | Miyoshi et al. | 324/307 |
| 2002/0050816 A1 | * | 5/2002 | Miyoshi | 324/307 |

FOREIGN PATENT DOCUMENTS

| | | | |
|---|---|---|---|
| EP | 1083438 A2 | * | 3/2001 |
| EP | 1115007 A1 | * | 7/2001 |
| JP | 8322817 | | 12/1996 |
| JP | 10075940 | | 3/1998 |

\* cited by examiner

*Primary Examiner*—Edward Lefkowitz
*Assistant Examiner*—Tiffany A. Fetzner
(74) *Attorney, Agent, or Firm*—Moonray Kojima (57) ABSTRACT

In order to reduce residual magnetization caused by gradient pulses, for a gradient pulse having either a positive or negative polarity, a residual magnetization reducing pulse is applied after applying the gradient pulse, or for two or more successively applied gradient pulses having different polarities, the amplitude of the gradient pulse(s) is adjusted to reduce residual magnetization thereafter.

20 Claims, 5 Drawing Sheets

MAGNETIC RESONANCE METHOD FOR REDUCING RESIDUAL MAGNETIZATION AND ADJUSTING THE AMPLITUDE OF GRADIENT PULSES

BACKGROUND OF THE INVENTION

The present invention relates to an MR (magnetic resonance) imaging method and MRI (magnetic resonance imaging) apparatus, and more particularly to an MR imaging method and MRI apparatus which can reduce residual magnetization caused by gradient pulses.

In prior art, Japanese Patent Application Laid Open No. H10-75940 discloses a technique involving:

(1) a phase shift measurement method comprising the steps of: executing a prescan sequence comprising transmitting an excitation RF pulse, transmitting an inversion RF pulse, applying a phase encoding pulse on a phase gradient axis, applying a read pulse on a read gradient axis and applying a rewinder pulse on the phase gradient axis, and subsequently transmitting an inversion RF pulse, applying a dephaser pulse on the phase gradient axis and collecting data from an echo while applying a read pulse on the phase gradient axis; and measuring a phase shift in subsequent echoes caused by the effect of eddy current or residual magnetization from the phase encoding pulse and so forth based on phase data obtained by performing one-dimensional Fourier transformation on the collected data, and (2) an MR imaging method employing a fast spin echo pulse sequence that involves repeatedly executing the following steps a plurality of times with a varying phase encoding pulse: after transmitting an excitation RF pulse, transmitting an inversion RF pulse, applying a phase encoding pulse on a phase gradient axis, collecting data from an echo while applying a read pulse on a read gradient axis, and applying a rewinder pulse on the phase gradient axis, thereby collecting data for a plurality of echoes with one excitation RF pulse, wherein a compensation pulse for compensating for a phase shift amount measured by the phase shift measurement method as described regarding (1) is either incorporated in the phase encoding pulse or appended either immediately before or immediately after or immediately before and after the phase encoding pulse, or incorporated in the rewinder pulse or appended either immediately before or immediately after or immediately before and after the rewinder pulse.

The above technique presupposes that the phase shift amount measured by the phase shift measurement method of (1) is equal to the phase shift amount generated in the fast spin echo pulse sequence of (2) before the compensation pulse is added.

However, these amounts are not always equal in the MRI apparatus because of the magnetic hysteresis characteristics of a magnetism conditioning plate or the like, and the presupposition in the above technique does not always hold. This will be explained with reference to FIGS. 1 and 2 hereinbelow.

Figure 1:
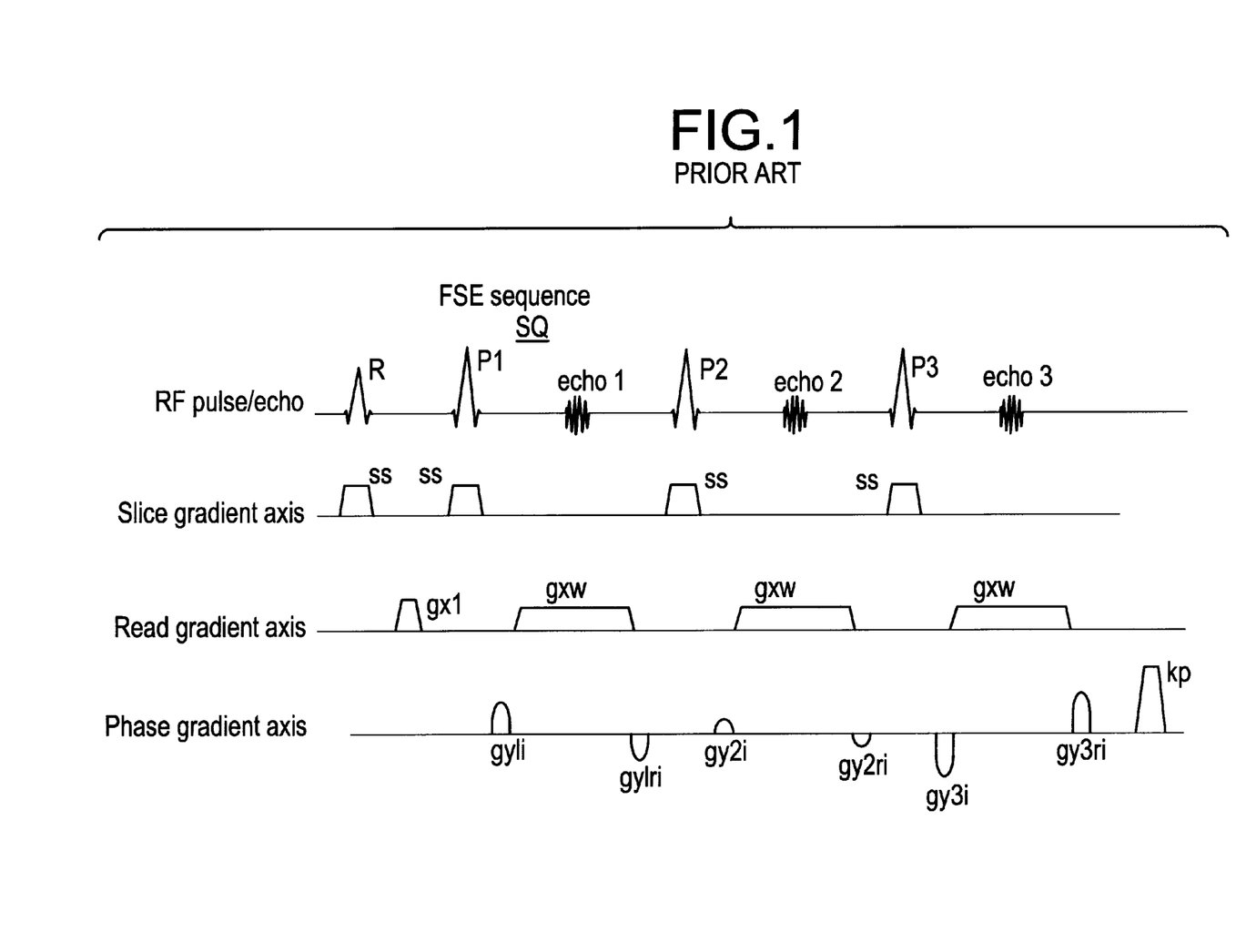
FIG. 1 is a chart of an exemplary pulse sequence of a conventional FSE sequence.

FIG. 1 is a pulse sequence chart according to a conventional fast spin echo (FSE) technique.

In an FSE sequence SQ, an excitation RF pulse R and a slice selective pulse ss are first applied. Next, a dephasing pulse gx1 is applied on a read gradient axis. Next, a first inversion RF pulse P1 and a slice selective pulse ss are applied. Next, a phase encoding pulse gy1i is applied on a phase gradient axis. Then, data is collected from a first echo echo1 while applying a read pulse gxw. Thereafter, a rewinder pulse gy1ri is applied on the phase gradient axis having the same area as, and a polarity opposite to, the phase encoding pulse gy1i. Reference symbol i represents a repetition number of the FSE sequence SQ in FIG. 1, and i=1—I (for example, I=128).

Next, a second inversion RF pulse P2 and a slice selective pulse ss are applied, a phase encoding pulse gy2i is applied on the phase gradient axis, data is collected from a second echo echo2 while applying a read pulse gxw, and then, a rewinder pulse gy2ri is applied on the phase gradient axis having the same area as, and a polarity opposite to, the phase encoding pulse gy2i.

Thereafter, and similarly, a j-th inversion RF pulse Pj and a slice selective pulse ss are applied, a phase encoding pulse gyji is applied on the phase gradient axis, data is collected from a j-th echo echoj while applying a read pulse gxw, and thereafter, a rewinder pulse gyjri is applied on the phase gradient axis having the same area as, and a polarity opposite to, the phase encoding pulse gyji, repeatedly for j=3—J (although J=8 for example, FIG. 1 shows a case that J=3).

And finally, a killer pulse of a large amplitude is applied on the phase gradient axis.

Figure 2:
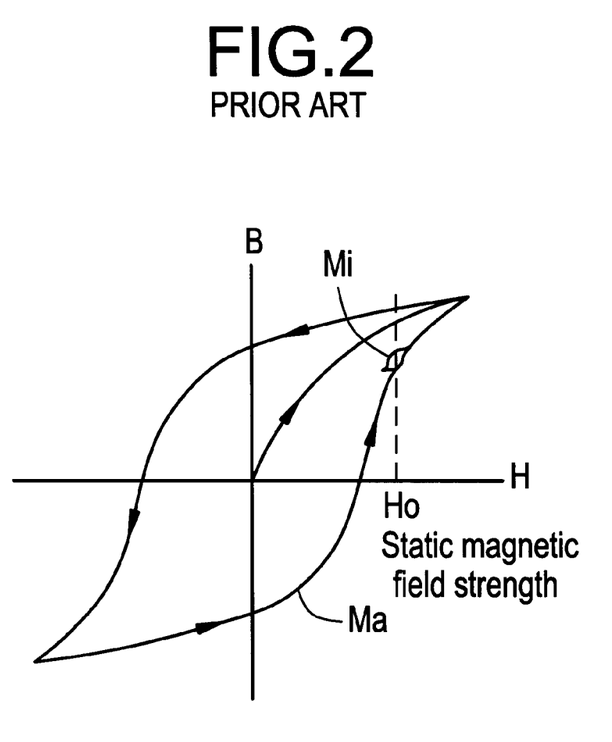
FIG. 2 is a diagram for explaining magnetic hysteresis characteristics.

FIG. 2 is diagram of the magnetic hysteresis characteristics of a ferromagnetic material such as a magnetism conditioning plate in the MRI apparatus.

The magnetization strength B of the ferromagnetic material such as the magnetism conditioning plate varies as indicated by a main loop Ma when the external magnetic field strength H is substantially changed, while it varies as indicated by a minor loop Mi when the change in the external magnetic field strength H is small. A gradient pulse corresponds to the small change in the external magnetic field strength H. Accordingly, application of a gradient pulse causes the magnetic strength B of the ferromagnetic material such as the magnetism conditioning plate to vary as indicated by the minor loop Mi.

Thus, the MRI apparatus has residual magnetization varying depending on a history of applying gradient pulses, owing to the magnetic hysteresis characteristics of a ferromagnetic material such as a magnetism conditioning plate.

However, since the prescan sequence as described regarding (1) does not take care of residual magnetization due to the killer pulse kp, the phase shift amount measured by the phase shift measurement method of (1) is not equal to the phase shift amount generated in the fast spin echo pulse sequence of (2) before the compensation pulse is added. That is, residual magnetization due to a killer pulse in an (i−1)th FSE sequence SQ affects all the echoes in an i-th FSE sequence SQ.

Moreover, the prescan sequence of (1) is in the form of a partially cut-out FSE sequence up to the first echo, and the history of applying gradient pulses of the prescan sequence is not equal to that of the MR imaging scan at and after the second echo. Therefore, the residual magnetization affects the second echo and the following echoes.

Thus, the conventional technique as described above has a problem that the effect of residual magnetization caused by gradient pulses cannot be sufficiently reduced.

SUMMARY OF THE INVENTION

It is therefore an object of the present invention to provide an MR imaging method and MRI apparatus which can sufficiently reduce the effect of residual magnetization due to gradient pulses.

In accordance with a first aspect of the present invention, there is provided an MR imaging method comprising the steps of applying a gradient pulse having either a positive or negative polarity on a gradient axis, and thereafter applying a residual magnetization reducing pulse having a polarity and amplitude to reduce residual magnetization caused by the gradient pulse.

In the MR imaging method of the first aspect, a residual magnetization reducing pulse is applied after a gradient pulse is applied. The residual magnetization reducing pulse has a polarity opposite to the gradient pulse, and has an amplitude that can reduce residual magnetization caused by the gradient pulse. Thus, the residual magnetization after the application of the residual magnetization reducing pulse is reduced to a negligible degree. Therefore, the effect of residual magnetization caused by a gradient pulse can be sufficiently reduced.

In accordance with a second aspect of the invention, there is provided an MR imaging method comprising the steps of applying a killer pulse on a gradient axis, and thereafter applying a residual magnetization reducing pulse having a polarity and amplitude to reduce residual magnetization caused by the killer pulse.

In this configuration, the killer pulse is a gradient pulse for eliminating transverse magnetization by forcible dephasing. The killer pulse is also referred to as a spoiler pulse.

In the MR imaging method of the second aspect, a residual magnetization reducing pulse is applied after a killer pulse is applied. The residual magnetization reducing pulse has a polarity opposite to the killer pulse, and has an amplitude that can reduce residual magnetization caused by the killer pulse. Thus, the residual magnetization after the application of the residual magnetization reducing pulse is reduced to a negligible degree. Therefore, residual magnetization due to a killer pulse kp in an (i−1)th FSE sequence SQ can be prevented from affecting data of an i-th FSE sequence SQ.

In accordance with a third aspect of the invention, there is provided an MR imaging method in which a phase encoding pulse is applied on a phase gradient axis, the method comprising the steps of: applying a residual magnetization reducing pulse after the phase encoding pulse, the residual magnetization reducing pulse having a polarity and amplitude to reduce residual magnetization caused by the phase encoding pulse, and additively increasing the area of the phase encoding pulse by the area of the residual magnetization reducing pulse.

In the MR imaging method of the third aspect, a residual magnetization reducing pulse is applied after a phase encoding pulse is applied. The residual magnetization reducing pulse has a polarity opposite to the phase encoding pulse, and has an amplitude that can reduce residual magnetization caused by the phase encoding pulse. Thus, the residual magnetization after the application of the residual magnetization reducing pulse is reduced to a negligible degree. Therefore, residual magnetization due to a phase encoding pulse can be prevented from affecting the subsequent data.

In accordance with a fourth aspect of the invention, there is provided an MR imaging method in which a phase encoding pulse is applied on a phase gradient axis and a rewinder pulse is applied after collecting an NMR signal, the method comprising the steps of: applying a residual magnetization reducing pulse after the phase encoding pulse, the residual magnetization reducing pulse having a polarity and amplitude to reduce residual magnetization caused by the phase encoding pulse, and additively increasing the area of the phase encoding pulse by the area of the residual magnetization reducing pulse, and further, applying a residual magnetization reducing pulse after the rewinder pulse, the residual magnetization reducing pulse having a polarity and amplitude to reduce residual magnetization caused by the rewinder pulse, and additively increasing the area of the rewinder pulse by the area of the residual magnetization reducing pulse.

In the MR imaging method of the fourth aspect, a residual magnetization reducing pulse is applied after a phase encoding pulse is applied. The residual magnetization reducing pulse has a polarity opposite to the phase encoding pulse, and has an amplitude that can reduce residual magnetization caused by the phase encoding pulse. Moreover, a residual magnetization reducing pulse is applied after a rewinder pulse is applied. The residual magnetization reducing pulse has a polarity opposite to the rewinder pulse, and has an amplitude that can reduce residual magnetization caused by the rewinder pulse. Thus, the residual magnetization after the application of the residual magnetization reducing pulse is reduced to a negligible degree. Therefore, residual magnetization due to a phase encoding pulse and a rewinder pulse can be prevented from affecting the subsequent data.

In accordance with a fifth aspect of the invention, there is provided an MR imaging method in which two or more gradient pulses having different polarities are successively applied on a gradient axis, comprising the step of determining respective amplitudes of the two or more gradient pulses to reduce residual magnetization after successively applying the two or more gradient pulses.

In the MR imaging method of the fifth aspect, because two or more gradient pulses having different polarities are successively applied, any new residual magnetization reducing pulse is not added, but instead, respective amplitudes of the two or more gradient pulses are adjusted to reduce residual magnetization to a negligible degree after successively applying the two or more gradient pulses. Therefore, residual magnetization after successively applying two or more gradient pulses can be prevented from affecting data.

In accordance with a sixth aspect of the invention, there is provided an MR imaging method in which a slice selective pulse is applied on a slice gradient axis and subsequently a rephasing pulse is applied, the method comprising the step of determining an amplitude of the rephasing pulse to reduce residual magnetization caused by the slice selective pulse.

In the MR imaging method of the sixth aspect, because a slice selective pulse and a rephasing pulse having different properties are successively applied, the amplitude of the rephasing pulse is adjusted to reduce residual magnetization to a negligible degree after successively applying the slice selective and rephasing pulses. Therefore, residual magnetization after successively applying a slice selective pulse and a rephasing pulse can be prevented from affecting data.

In accordance with a seventh aspect of the invention, there is provided an MR imaging method in which a dephasing pulse is applied on a read gradient axis and thereafter a read pulse is applied, comprising the step of determining an amplitude of the dephasing pulse so that the read pulse can reduce residual magnetization caused by the dephasing pulse.

In the MR imaging method of the seventh aspect, because a dephasing pulse and a read pulse having different polarities are successively applied, the amplitude of the dephasing pulse is adjusted to reduce residual magnetization to a negligible degree after successively applying the dephasing and read pulses. Therefore, residual magnetization after successively applying a dephasing pulse and a read pulse can be prevented from affecting data.

In accordance with an eighth aspect of the invention, there is provided an MR imaging method in which gradient moment nulling (GMN) phase compensation pulses are applied on a gradient axis, the method comprising the step of determining respective amplitudes of the GMN phase compensation pulses to reduce residual magnetization after applying the GMN phase compensation pulses.

In the above configuration, the GMN phase compensation pulse is defined as a gradient pulse having a waveform designed to eliminate motion-induced phase variation of nuclear spins.

In the MR imaging method of the eighth aspect, because GMN phase compensation pulses in which two or more gradient pulses having different polarities are combined are applied, the respective amplitudes of the gradient pulses are adjusted to reduce residual magnetization to a negligible degree after successively applying the GMN phase compensation pulses. Therefore, residual magnetization after successively applying GMN phase compensation pulses can be prevented from affecting data.

Thus, according to the MR imaging method and MRI apparatus of the present invention, for a gradient pulse having either a positive or negative polarity, a residual magnetization reducing pulse is applied after applying the gradient pulse, or for two or more successively applied gradient pulses having different polarities, the amplitude of the gradient pulse(s) is adjusted to reduce residual magnetization thereafter, and hence, an unwanted phase error does not occur and image quality degradation such as ghosting or shading can be prevented.

Further objects and advantages of the present invention will be apparent from the following description of the preferred embodiments of the invention as illustrated in the accompanying drawings.

DETAILED DESCRIPTION OF THE INVENTION

The present invention will now be described in more detail with reference to several embodiments shown in the accompanying drawings.

First Embodiment

Figure 3:
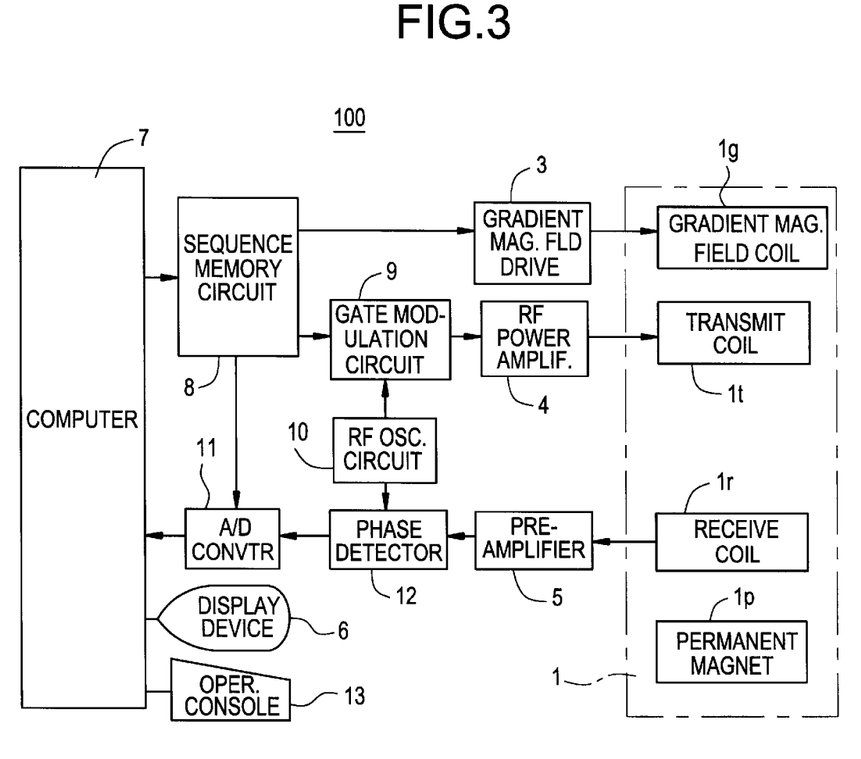
FIG. 3 is a block diagram illustrating an MRI apparatus in accordance with a first embodiment of the present invention.

FIG. 3 is a block diagram of an MRI apparatus in accordance with a first embodiment of the present invention.

In the MRI apparatus 100, a magnet assembly 1 has therein an empty portion (bore) for inserting a subject, and surrounding the empty portion are disposed a permanent magnet 1p for applying a static magnetic field having a constant strength $H_0$ to the subject, a gradient magnetic field coil 1g for applying gradient pulses on a slice gradient axis, phase gradient axis and read gradient axis, a transmit coil 1t for supplying an RF pulse for exciting spins of atomic nuclei within the subject, and a receive coil 1r for detecting an NMR signal from the subject. The gradient magnetic field coil 1g, transmit coil 1t and receive coil 1r are connected to a gradient magnetic field drive circuit 3, an RF power amplifier 4 and a preamplifier 5, respectively.

It should be noted that a superconductive or normal conductive magnet may be employed instead of the permanent magnet.

A sequence memory circuit 8 operates the gradient magnetic field drive circuit 3 following instructions from a computer 7 based on a stored pulse sequence, to drive the gradient magnetic field coil 1g in the magnet assembly 1 to apply a gradient pulse. The sequence memory circuit 8 also operates a gate modulation circuit 9 to modulate a carrier output signal from an RF oscillation circuit 10 into a pulsed signal having a certain timing and envelope shape. The pulsed signal is applied as an RF pulse to the RF power amplifier 4, power-amplified in the RF power amplifier 4, and applied to the transmit coil 1t in the magnet assembly 1 to selectively excite a desired slice region.

The preamplifier 5 amplifies an NMR signal detected by the receive coil 1r in the magnet assembly 1 from the subject, and inputs the signal to a phase detector 12. The phase detector 12 phase-detects the NMR signal from the preamplifier 5 with reference to the carrier output signal from the RF oscillation circuit 10, and supplies the phase-detected signal to an A/D converter 11. The A/D converter 11 converts the phase-detected analog signal into a digital signal, and inputs it to the computer 7.

The computer 7 reads the data from the A/D converter 11, and performs image reconstruction operation to produce an image of the desired slice region. The image is displayed on a display device 6. The computer 7 is also responsible for overall control such as receiving information input from an operator console 13.

Figure 4:
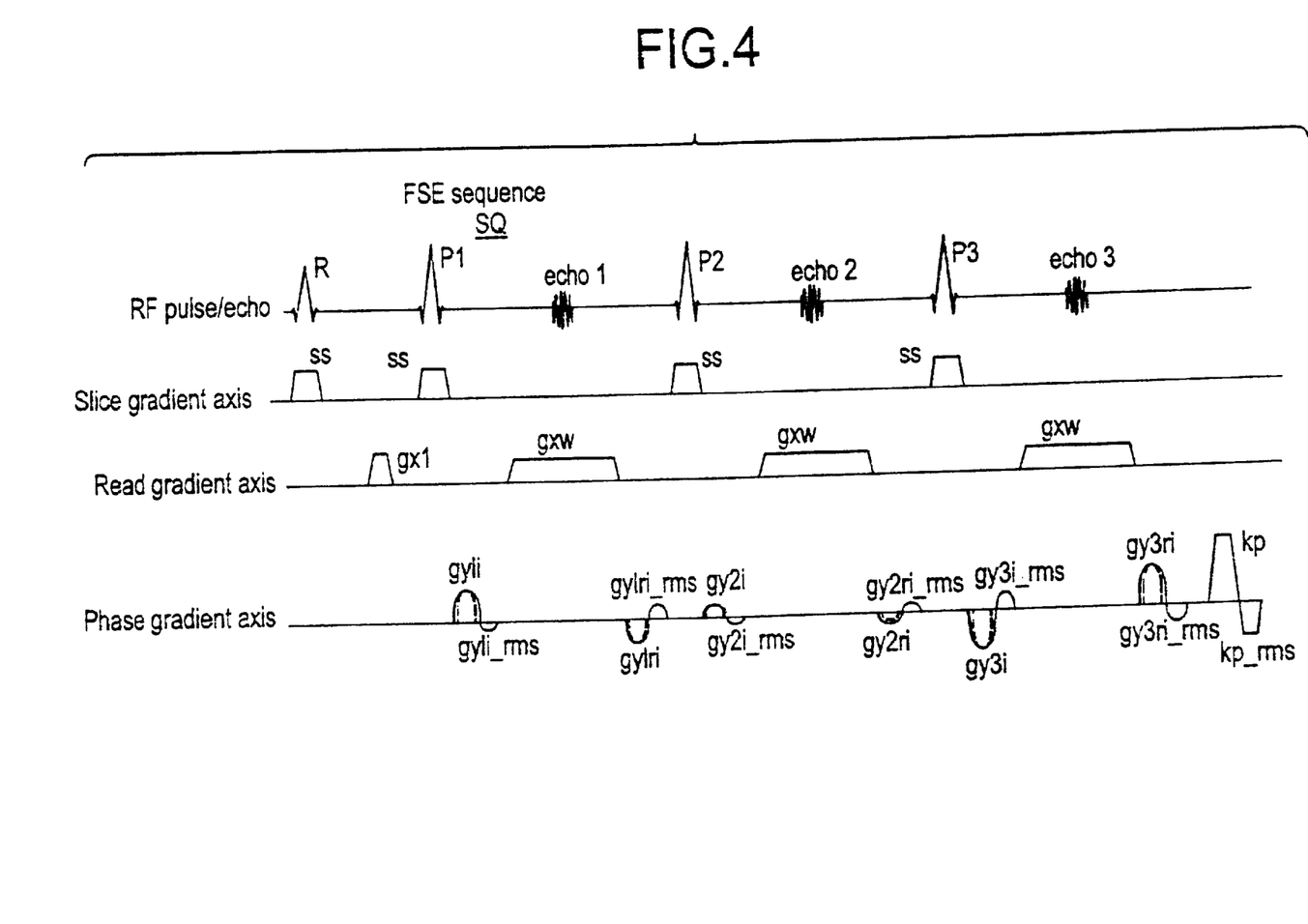
FIG. 4 is a chart of an exemplary pulse sequence of an FSE sequence in accordance with the first embodiment.

FIG. 4 is a chart of a pulse sequence of a fast spin echo technique in accordance with the present invention.

In the FSE sequence SQ, an excitation RF pulse R and a slice selective pulse ss are first applied. Next, a dephasing pulse gx1 is applied on a read gradient axis. Next, a first inversion RF pulse P1 and a slice selective pulse ss are applied.

Next, a phase encoding pulse gy1i is applied on a phase gradient axis. Subsequently, a residual magnetization reducing pulse gy1i_rms is applied having an opposite polarity and an amplitude to cancel residual magnetization due to the phase encoding pulse gy1i. It should be noted that the area of the phase encoding pulse gy1i is increased by the area of the residual magnetization reducing pulse gy1i_rms to prevent the phase encoding amount from being varied by the residual magnetization reducing pulse gy1i_rms.

The amplitude that can cancel the residual magnetization due to the phase encoding pulse gy1i is basically about half the amplitude of the phase encoding pulse gy1i because the magnetic hysteresis characteristic curve has a point symmetrical shape. However, since the amplitude may be varied depending on material of a magnetism conditioning plate or characteristics of the gradient magnetic field coil 1g, it is preferred that the amplitude be determined by simulation using a mathematical model of the minor loop Mi or by experiment.

Then, data is collected from a first echo echo1 while applying a read pulse gxw.

Thereafter, a rewinder pulse gy1ri is applied on the phase gradient axis having the same area as, and a polarity opposite to, the phase encoding pulse gy1i. Subsequently, a residual magnetization reducing pulse gy1ri_rms is applied having an opposite polarity and an amplitude to cancel residual magnetization due to the rewinder pulse gy1ri. It should be noted that the area of the rewinder pulse gy1ri is increased by the area of the residual magnetization reducing pulse gy1ri_rms to prevent the phase encoding amount from being varied by the residual magnetization reducing pulse gy1ri_rms. Although the amplitude of the residual magnetization reducing pulse gy1ri_rms is basically about half the amplitude of the rewinder pulse gy1ri similarly to above, it is preferred that the amplitude be determined by simulation or by experiment.

Reference numeral i is the repetition number of the FSE sequence SQ shown in FIG. 4, and i=1—I (I=128, for example).

Then, a second inversion RF pulse P2 and a slice selective pulse ss are applied, a phase encoding pulse gy2i is applied on the phase gradient axis, and a residual magnetization reducing pulse gy2i_rms is applied similarly to above. Next, data is collected from a second echo echo2 while applying a read pulse gxw. Thereafter, a rewinder pulse gy2ri is applied on the phase gradient axis having the same area as, and a polarity opposite to, the phase encoding pulse gy1i, and a residual magnetization reducing pulse gy2ri_rms is applied similarly to above.

Thereafter, and similarly, a j-th inversion RF pulse Pj and a slice selective pulse ss are applied, a phase encoding pulse gyji and a residual magnetization reducing pulse gyji_rms are applied on the phase gradient axis, data is collected from a j-th echo echoj while applying a read pulse gxw, and then a rewinder pulse gyjri having the same area as, and a polarity opposite to, the phase encoding pulse gyji, and a residual magnetization reducing pulse gyjri_rms are applied on the phase gradient axis, repeatedly for j=3—J (although J=8 for example, FIG. 4 shows a case that J=3).

And finally, a killer pulse kp of a large amplitude is applied on the phase gradient axis, and subsequently a residual magnetization reducing pulse kp_rms is applied having an opposite polarity and an amplitude to cancel residual magnetization due to the killer pulse kp.

According to the MRI apparatus 100, residual magnetization due to a phase encoding pulse, rewinder pulse and killer pulse can be reduced, and therefore image quality degradation such as ghosting and shading can be restrained from being generated in an image by the residual magnetization.

Second Embodiment

Subsequent to a killer pulse of an inversion recovery technique or a killer pulse for a saturation pulse, a residual magnetization reducing pulse may be applied having an opposite polarity and an amplitude to cancel residual magnetization due to such killer pulses.

Third Embodiment

A residual magnetization saturation pulse of a maximum amplitude may be applied immediately before an excitation pulse, and subsequently a residual magnetization reducing pulse may be applied having an opposite polarity and an amplitude to cancel residual magnetization due to the residual magnetization saturation pulse.

Fourth Embodiment

Figure 5:
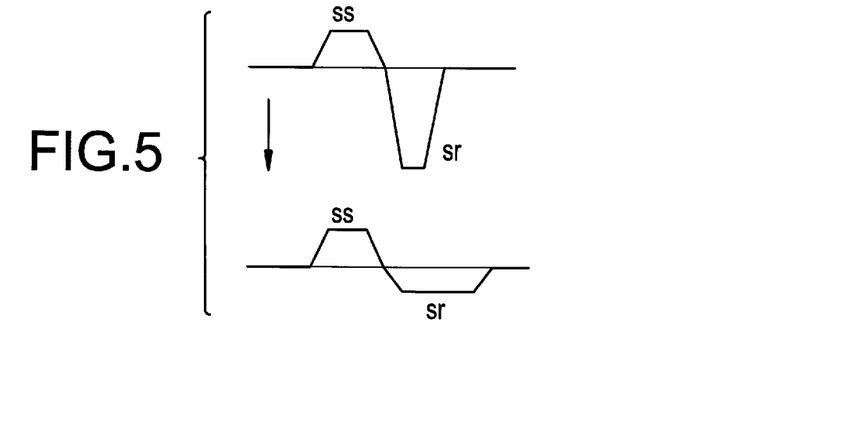
FIG. 5 is a diagram for explaining a fourth embodiment in which the present invention is applied to a combination of a slice selective pulse and a rephasing pulse.

In a pulse sequence in which a slice selective pulse ss is followed by a rephasing pulse sr having an opposite polarity, as shown in FIG. 5, the amplitude of the rephasing pulse sr may be adjusted to reduce residual magnetization due to the slice selective pulse ss. However, the time width of the rephasing pulse sr should be also adjusted in order not to vary the area.

This can reduce residual magnetization after applying the slice selective pulse ss followed by the rephasing pulse sr.

Fifth Embodiment

Figure 6:
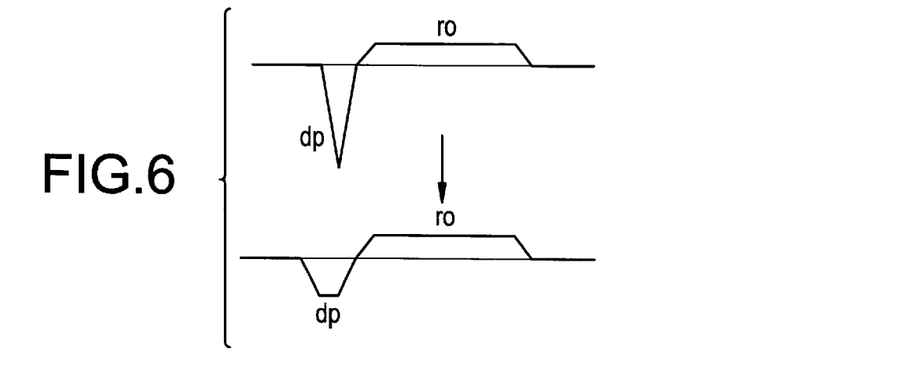
FIG. 6 is a diagram for explaining a fifth embodiment in which the present invention is applied to a combination of a dephasing pulse and a read pulse.

In a gradient echo-type pulse sequence in which an opposite-polarity dephasing pulse dp is applied before a read pulse ro as shown in FIG. 6, the amplitude of the dephasing pulse dp may be adjusted to reduce residual magnetization due to the read pulse ro. However, the time width of the dephasing pulse dp should be also adjusted in order not to vary the area.

This can reduce residual magnetization after applying the read pulse ro followed by the dephasing pulse dp.

Sixth Embodiment

Figure 7:
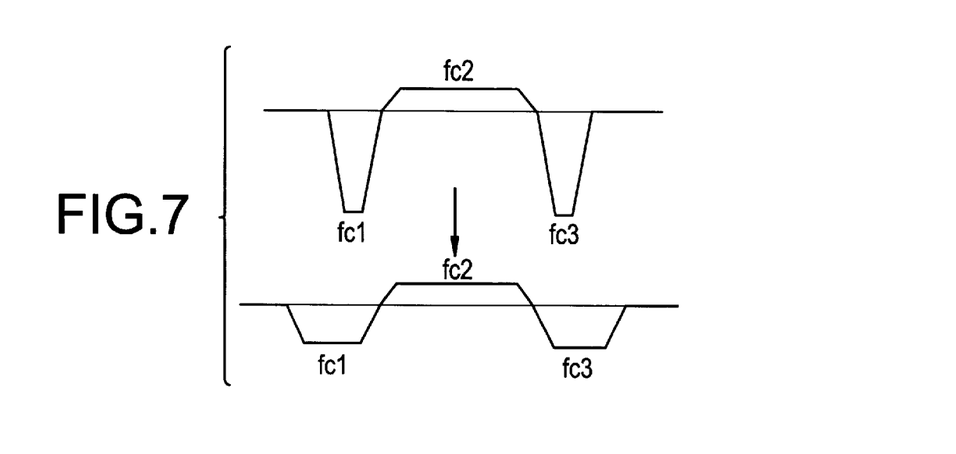
FIG. 7 a diagram for explaining a sixth embodiment in which the present invention is applied to phase compensation pulses.

In a pulse sequence in which first-order GMN phase compensation pulses are applied having three combined gradient pulses fc1, fc2 and fc3 of different polarities, as shown in FIG. 7, The respective amplitudes of the gradient pulses fc1, fc2 and fc3 may be adjusted so that residual magnetization after applying the phase compensation pulses becomes as small as possible. However, the respective time widths of the gradient pulses fc1, fc2 and fc3 should also adjusted in order not to vary the area.

This can reduce residual magnetization after applying phase compensation pulses.

Many widely different embodiments of the invention may be configured without departing from the spirit and the scope of the present invention. It should be understood that the present invention is not limited to the specific embodiments described in the specification, except as defined in the appended claims.

What is claimed is:

1. An MR imaging method using a fast spin echo technique, comprising the steps of:
   applying an RF pulse;
   applying a slice selective pulse;
   applying a dephasing pulse on a read gradient axis;
   applying a positive phase encoding pulse on a phase gradient axis;
   applying immediately after said positive phase encoding pulse a negative first residual magnetization reducing pulse on said phase gradient axis, said negative first residual magnetization reducing pulse having one half of the amplitude of said positive phase encoding pulse to cancel all residual magnetization caused by said positive phase encoding pulse; and
   collecting data from a first echo while concurrently applying a read pulse.

2. In an MRI apparatus comprising:
   an RF pulse transmitting means;
   a gradient pulse applying means; and
   an NMR signal receiving means, the improvement comprising:
   first means for applying an RF pulse;
   second means for applying a slice selective pulse;

third means for applying a dephasing pulse on a road gradient axis;

fourth means for applying a positive phase encoding pulse on a phase gradient axis;

fifth means for applying immediately after said positive phase encoding pulse a negative first residual magnetization reducing pulse on said phase gradient axis, said negative first residual magnetization reducing pulse having an opposite polarity and one half the amplitude of said positive phase encoding pulse to cancel all residual magnetization caused by said positive phase encoding pulse; and sixth means for collecting data from a first echo while concurrently applying a read pulse.

3. An MRI imaging method using a fast spin echo technique, comprising the steps of:

applying an excitation RF pulse together with a slice selective pulse;

applying a first inversion RF pulse together with a slice selective pulse;

applying a dephasing pulse on a read gradient axis;

applying a phase encoding pulse on a phase gradient axis;

applying immediately after said phase encoding pulse a first residual magnetization reducing pulse on said phase gradient axis, said first residual magnetization reducing pulse having an opposite polarity and amplitude to cancel residual magnetization due to said phase encoding pulse;

collecting data from a first echo while concurrently applying a read pulse on said read gradient axis;

applying a second inversion RF pulse together with a slice selective pulse;

applying a residual magnetization saturation pulse of maximum amplitude immediately before said second inversion RF pulse is applied; and subsequently thereafter, applying a second residual magnetization reducing pulse having an opposite polarity and amplitude to cancel residual magnetization caused by said residual magnetization saturation pulse.

4. The method of claim 3, wherein an area of said phase encoding pulse is increased by an area of residual magnetization pulse thereby to prevent phase encoding amount from being varied by said residual magnetization reducing pulse.

5. The method of claim 3, wherein said amplitude of said first residual magnetization reducing pulse is about one half of amplitude of said phase encoding pulse.

6. The method of claim 3, further comprising the steps of applying a rewinder pulse after collecting an NMR signal; and applying a second residual magnetization reducing pulse after said reminder pulse, said second residual magnetization pulse being similar and causing similar effects as said first residual magnetization reducing pulse.

7. The method of claim 6, further comprising the steps of applying a killer pulse after said second residual magnetization reducing pulse, and then after said killer pulse is applied, applying a residual magnetization reducing pulse of suitable polarity and amplitude to reduce residual magnetization caused by said killer pulse.

8. The method of claim 3, further comprising the steps of applying a rephasing pulse or appropriate polarity after said slice selective pulse is applied, and then adjusting said rephasing pulse to reduce residual magnetization caused by said slice selective pulse, and adjusting the time width of said rephasing pulse to keep constant the area thereof.

9. The method of claim 3, wherein said dephasing pulse is applied prior to said read pulse, and further comprising the steps of adjusting amplitude of said dephasing pulse to reduce residual magnetization caused by said read pulse, and adjusting time width of said dephasing pulse to keep constant the area thereof.

10. The method of claim 3, further comprising the steps of applying three combined gradient pulses, applying phase compensation pulses, and adjusting amplitude of said gradient pulses to be as small as possible to reduce residual magnetization after applying said phase compensation pulses.

11. The method of claim 3, further comprising the steps of applying two or more gradient moment nullifying phase compensation pulses, and determining amplitudes of said gradient moment nullifying phase compensation pulses to reduce residual magnetization after applying said gradient moment nullifying phase compensation pulses.

12. In an MRI apparatus comprising:

an RF pulse transmitting means;

a gradient pulse applying means; and an NMR signal receiving means, the improvement comprising:

first means for applying an excitation rF pulse together with a slice selective pulse;

second means for applying a first inversion RF pulse together with a slice selective pulse;

third means for applying a dephasing pulse on a read gradient axis;

fourth means for applying a phase encoding pulse on a phase gradient axis;

fifth means for applying immediately after said phase encoding pulse a first residual magnetization reducing pulse on said phase gradient axis, said residual magnetization reducing pulse having an opposite polarity and amplitude to cancel residual magnetization due to said phase encoding pulse;

sixth means for collecting data from a first echo while concurrently applying a read pulse on said read gradient axis;

seventh means for applying a second inversion RF pulse together with a slice selective pulse;

eighth means for applying a residual magnetization saturation pulse of maximum amplitude immediately before said second inversion RF pulse is applied; and subsequently thereafter said fifth means applies a second residual magnetization reducing pulse having an opposite polarity and amplitude to cause cancellation of residual magnetization caused by said residual magnetization saturation pulse.

13. The apparatus of claim 12, wherein said fourth means comprises means for increasing an area of said phase encoding pulse by an area of said residual magnetization reducing pulse thereby to prevent a phase encoding amount from being varied by said residual magnetization reducing pulse.

14. The apparatus of claim 12, wherein said fifth means comprises means for applying a first residual magnetization reducing pulse which is about one half of the amplitude of said pulse encoding pulse.

15. The apparatus of claim 12, further comprising ninth means for applying a rewinder pulse after collecting an NMR signal; and wherein said fifth means applies a second residual magnetization reducing pulse after said rewinder pulse, said second residual magnetization reducing pulse being similar and causing similar effects as said first residual magnetization reducing pulse.

16. The apparatus of claim 15, further comprising tenth means for applying a killer pulse after said second residual magnetization reducing pulse, and wherein said fifth means applies after said killer pulse a residual magnetization reducing pulse of opposite polarity and amplitude to reduce residual magnetization caused by said killer pulse.

17. The apparatus of claim 12 further comprising ninth means for applying a rephasing pulse of appropriate polarity after application of said slice selective pulse, and means for adjusting said rephasing pulse to reduce residual magnetization caused by said slice selective pulse, and means for adjusting the time width of said rephasing pulse to keep constant the area thereof.

18. The apparatus of claim 12, wherein said third means comprises means for applying said dephasing pulse prior to said read pulse, means for adjusting amplitude of said dephasing pulse to reduce residual magnetization caused by said read pulse, and means for adjusting the time width of said dephasing pulse to keep the area thereof constant.

19. The apparatus of claim 12, further comprising means for applying three combined gradient pulses, means for applying phase compensation pulses, and means for adjusting the amplitude of said gradient pulses to be as small as possible to reduce residual magnetization after applying said phase compensation pulses.

20. The apparatus of claim 12, further comprising means for applying two or more gradient moment nullifying phase compensation pulses, and means for determining amplitudes thereof so as to reduce residual magnetization caused thereby.

\* \* \* \* \*